United States Patent
Dasgupta

[19]
[11] Patent Number: 6,101,450
[45] Date of Patent: Aug. 8, 2000

[54] STRESS ANALYSIS USING A DEFECT-FREE FOUR-NODE FINITE ELEMENT TECHNIQUE

[75] Inventor: Gautam Dasgupta, New York, N.Y.

[73] Assignee: The Trustees of Columbia University in the City of New York, New York, N.Y.

[21] Appl. No.: 08/868,238

[22] Filed: Jun. 3, 1997

Related U.S. Application Data

[60] Provisional application No. 60/019,110, Jun. 3, 1996.

[51] Int. Cl.$^7$ ................................ G01L 1/24; G01B 11/16
[52] U.S. Cl. ............................ 702/42; 702/11; 356/35.5; 356/32
[58] Field of Search ........................... 702/11, 42; 707/3; 623/11, 16; 345/420, 423; 364/578; 428/366; 106/644; 73/597, 37; 356/32, 35.5

[56] References Cited

U.S. PATENT DOCUMENTS

| | | | |
|---|---|---|---|
| 4,079,165 | 3/1978 | Morley | 428/366 |
| 4,979,992 | 12/1990 | Bache | 106/644 |
| 5,408,882 | 4/1995 | McKinley et al. | 73/597 |
| 5,417,103 | 5/1995 | Hunter et al. | 73/37 |
| 5,438,402 | 8/1995 | Gupta | 356/35.5 |
| 5,440,674 | 8/1995 | Park | 345/423 |
| 5,524,636 | 6/1996 | Sarvazyan et al. | 600/587 |
| 5,737,277 | 4/1998 | Priest | 702/11 |
| 5,774,124 | 6/1998 | Itoh et al. | 345/423 |
| 5,796,617 | 8/1998 | Ville | 364/468.04 |

*Primary Examiner*—James P. Trammell
*Assistant Examiner*—Cuong H. Nguyen
*Attorney, Agent, or Firm*—Baker Botts LLP

[57] ABSTRACT

Stress, strain and displacement in two-dimensional regions can be calculated by computerized techniques. In the x–y plane, a region is discretized into four-node finite elements such as quadrilaterals and triangles with side nodes. Each such element has eight distinct deformation modes. These correspond to three rigid-body displacements, three uniform strain profiles for compressible materials or two deviatoric strain fields accompanied by an isotropic pressure for incompressible materials, and two flexures. Pointwise equilibrium requires the bending shapes to be functions of Poisson's ratio. Nodal equilibrium and compatibility are satisfied for prescribed loads implementing exact differentiation and integration. Element volume change parameters for compressible materials or isotropic pressure for incompressible materials are eliminated, and a linear system of equations is formed in terms of the seven remaining unknowns per element employing a neural-network solution strategy to pass simultaneously the patch and zero-locking tests. The strain and stress distributions including isotropic pressure for incompressible materials, and displacement profiles are solved as x–y polynomials. This technique, Tessellica, can be used in computer-aided design, and can be integrated in subsequent manufacture or construction of buildings, bridges, dams, ships, aircraft and automobiles, for example, and in bioengineering applications.

18 Claims, 6 Drawing Sheets

STRESS ANALYSIS USING A DEFECT-FREE FOUR-NODE FINITE ELEMENT TECHNIQUE

This application claims benefit of Provisional Appl. Ser. No. 60/019,110 filed Jun. 3, 1996.

The present specification includes a microfiche appendix having one microfiche with seventeen frames, which is referred to in the specification as the Appendix.

BACKGROUND OF THE INVENTION

The invention relates to solid-body stress analysis and, more specifically, to the analysis of uniform stress due to compression, stretching, shearing and/or pure bending individually or in combination, of a two-dimensional solid of uniform thickness.

Stress analysis is used primarily in the design of solid structures such as buildings, bridges, dams, and automobiles, ships and aircraft, for determining structural behavior and for ascertaining structural viability and integrity under anticipated or foreseeable loads. Another important field of application is in bioengineering, for hard and soft tissue.

The analysis may involve the use of an abstract or mathematical "model" for the representation of the structural system and loads. In classical analytical idealization, partial differential equations are used. For example, stress in a dam under a hydrostatic load can be described by an elliptic partial differential equation in two spatial dimensions.

As boundary geometry of structural systems is usually complicated, the partial differential equations of structural mechanics typically cannot be solved in the closed analytical exact form. Numerical approximations are sought instead. In one approach, derivatives are replaced with finite differences. Other methods are based on finding an approximation as a linear combination of preassigned functions such as polynomials or trigonometric functions. Also, after a domain or a boundary of interest has been subdivided in the manner of a tiling or tessellation, a piece-wise approximation can be sought according to the finite element method or the boundary element method, respectively. For example, in the case of a two-dimensional domain or surface, triangles can be used for complete tessellation. More generally, "element" refers to any suitable sub-domain of a domain or a boundary portion of interest.

While triangulation is effective and well-understood for compression, shearing and stretching, it tends to incur unacceptably large approximation error for bending. Instead, if quadrilaterals could be used throughout the domain or in a sub-domain, accuracy would be improved. While using a quadrilateral as a straightforward replacement of two triangles, it has been found that an additional approximation error arises due to artificial "stiffening", or additional zero-energy modes are encountered other than rigid-body responses. In the interest of computational accuracy and efficient design, new finite elements are needed which are free of such modeling errors. Desired elements have been termed "defect-free".

The following publications are listed for further background and for an introduction to the computer programming language "Mathematica":

R. H. MacNeal, "A Theorem Regarding the Locking of Tapered Four-noded Membrane Elements", *International Journal of Numerical Methods in Engineering*, Vol. 24, pp. 1793–1799, 1978;

O. C. Zienkiewicz et al., *The Finite Element Method* (4th edition), Vols. 1 and 2, McGraw-Hill, New York, 1989;

R. H. MacNeal, *Finite Elements: Their Design and Performance*, Marcel Dekker, New York, 1994;

S. Wolfram, *The Mathematica Book*, (3rd edition), Cambridge University Press, New York, 1996.

SUMMARY OF THE INVENTION

For constructing test functions for two-dimensional defect-free solid elements, (i) dimensionless element constitutive parameters such as Poisson's ratio(es), and (ii) arbitrary convex geometrical shapes quantified by shape weights are used. By contrast, in the conventional finite element method, only item (ii) and not item (i) is used in the description of the shape functions.

For four prescribed nodes in the x–y plane of a generic element, the defect-free force-displacement relations are generated for each of the eight distinct deformation modes. By contrast, in the conventional finite element method, a single stiffness matrix is computed to encompass deformations associated with all nodal variables.

The nodes may form a convex quadrilateral or a triangle. For the latter, besides the nodes at the vertices, an additional node lies at an intermediate point on one side of the triangle.

A two-dimensional four-node element has eight distinct modes denoted by modal participation factors $\phi_i$:

$\phi_1, \phi_2, \phi_3$ for respective rigid body modes x-displacement, y-displacement, and rotation in the x–y plane;

$\phi_4, \phi_5$ for deviatoric modes associated with uniform stress/strain fields;

$\phi_6, \phi_7$ for bending modes; and $\phi_0$ being associated with the volume change for a compressible material, but denoting the isotropic pressure for an incompressible material. (For an incompressible material, the traditional notation $p_0$ is used instead of $\phi_0$.)

Each mode $\phi_i$ is described by two displacement fields: $\{u(x,y)\}_i$ in the x-direction; and $\{v(x,y)\}_i$ in the y-direction. The defect-free element requires the test functions $\{u(x,y)\}_i$ and $\{v(x,y)\}_i$ to satisfy the pointwise stress equilibrium equation. The conventional finite element method does not need such strong conditions. Hence, for ease of formulation, the shape functions are selected solely on the basis of nodal point coordinates, and beyond triangular elements the conventional finite element shape functions do not satisfy the stress equilibrium condition for all interior points. For stress analysis problems, in the conventional finite element method, a variational theorem satisfies the equilibrium condition in an over-all average sense. Such a weak formulation is inappropriate for the construction of defect-free elements.

Four node elements, beyond the triangular elements, bring flexural (or bending) deformation into play. These modes, which are of special interest here, are elaborated as follows:

For four prescribed nodes in the x–y plane of a solid body of interest, a defect-free finite element nodal force-displacement relationship is generated. The nodes may form a quadrilateral or a triangle. For the latter, an additional node lies at an intermediate point on one side of the triangle. A two-dimensional four-node finite element has eight modes, namely the three rigid-body modes, the three uniform-stress (or patch) modes, and two bending modes. The latter two modes, which are of special interest here, are elaborated as follows:

For x-span bending, for an isotropic material, the x-displacement component $u(x,y)$ is $x \cdot y$, and the y-displacement component v(x,y) is a rational function whose definition involves Poisson's ratio ν of the domain.

For a thin (plane stress), sheet-like isotropic body, the y-displacement component v(x,y) of the x-span bending mode is $-\frac{1}{2}\cdot(x^2+\nu/(1-\nu)\cdot y^2)$. Instead, for a thick (plane strain) isotropic body such as a dam, for example, the y-displacement component v(x,y) of the x-span bending mode is $-\frac{1}{2}\cdot(x^2+\nu\cdot y^2)$.

For the second bending mode, i.e., for y-span bending, the displacement components are obtained from symmetry, i.e., by interchanging the roles of x and y in the definitions for x-span bending.

In general, for an anisotropic domain, both displacement components of each bending mode will be rational functions having a quadratic numerator and a linear denominator in spatial coordinates, and the coefficients will be functions of multiple Poisson's ratios.

Since the principle of superposition in the quadratic (nonlinear) bending shape functions associated with the nodal displacements is not valid, a linear system is formulated via the modal participation factors denoted by $\phi$'s.

For compressible materials there is a volume change indicator $\phi_0$; for incompressible materials, with $\phi_0$ identically zero, the associated isotropic pressure $p_0$ is the variable to be determined.

For each mode $\phi_i=1$, i.e., for unit-value of a modal participation factor, in an element, the variables $\{u(x,y)\}_i$ and $\{v(x,y)\}_i$ are sampled at the element nodes to obtain the modal displacement $\{r\}_i$. Appropriate components of the stress distribution $\{\sigma(x,y)\}_i$ are evaluated as analytical functions in x and y which are integrated in the closed form to obtain the corresponding nodal forces $\{F\}_i$.

For compressible materials, both $\{r\}_i$ and $\{F\}_i$ depend upon $\phi_0, \phi_1, \ldots, \phi_7$. For incompressible materials, $\{r\}_i$ depends upon $\phi_1, \phi_2, \ldots, \phi_7$, and $\{F\}_i$ depends upon $\phi_1, \phi_2, \ldots, \phi_7$ and $p_0$. This observation is incorporated in designing the neural network model of the equation solver utilized here.

The compatibility condition is that for all elements meeting at a node, one displacement component is calculated weighing $\{r\}_i$ with respect to $\phi_i$. The first system of equations is formed enforcing the same value for a displacement component to all elements common to that node. The equilibrium condition is that for all elements meeting at a node one force component is calculated weighing $\{F\}_i$ with respect to $\phi_i$. The second system of equations is formed enforcing the sum of all element forces to equal the externally applied force component at that node.

The symbolic equation solver in Mathematica eliminates expressions associated with the symbolic variables $\phi_0$ (volume change) or $p_0$ (pressure), and renders a system of linear equations in terms of the modal variables $\phi_1, \phi_2, \ldots, \phi_7$ tagged with element number.

The technique is not based on formulating finite element stiffness matrices, but uses the element nodal force-displacement transformations to obtain a system of linear equations in terms of the modal variables $\phi_1, \phi_2, \ldots, \phi_7$.

Different Mathematica objects related to solving equations are employed in order to implement a neural network solution strategy. Therein, the linear system of equations is constructed internally from the element nodal force displacement pairs according to the symbolic rule stating nodal compatibility and equilibrium pertaining to the mesh description prescribed by the nodal point connection list.

After the numerical values are obtained for the modal participation factors $\phi_1, \phi_2, \ldots, \phi_7$ for each element, the volume change $\phi_0$ in the compressible case or the isotropic element pressure $p_0$ in the incompressible case is obtained from the equilibrium equations.

The exact displacement fields u(x,y), v(x,y) are obtained, in x- and y-directions, respectively. Using the numerical values of the $\phi$'s, the exact stress fields are obtained as $\sigma_{xx}(x,y)$ and $\sigma_{yy}(x,y)\cdot\tau_{xy}(x,y)$, and the exact strain fields as $\epsilon_{xx}(x,y)$ and $\epsilon_{yy}(x,y)\cdot\gamma_{xy}(x,y)$. Being exact, these are the best possible solutions for a four-node element.

BRIEF DESCRIPTION OF THE DRAWING AND THE APPENDIX

The Appendix includes two program listings, namely a 6-page listing for compressible materials and a 2-page listing for incompressible materials ($\nu=\frac{1}{2}$). These programs are written in the Mathematica computer programming language and represent an exemplary embodiment of the present technique, designated as "Tessellica".

Further included in the Appendix are four examples of Tessellica output for the beam specimens of FIGS. 5–8, identified as "2-Element Cantilever", "Triangulation in Plane Strain Incompressible Patch Test", "Incompressible Case" and "Incompressible Quadrilaterals". In each case, the present technique captures exact values correct to at least seven decimal places.

DETAILED DESCRIPTION

While the formulation of the stiffness matrix using the nodal degrees-of-freedom is characteristic of all known finite element methods, it cannot be used when the defect-free characteristic is sought. The necessary quadratic polynomial shape functions yield those nodal loads for uniform axial and shear stresses which violate nodal equilibrium in a patch test for compressible materials. In the case of incompressible materials, with Poisson's ratio $\nu=\frac{1}{2}$, it is not possible to apply arbitrary nodal displacements because the zero volume change constraint must be met. Hence, the nodal displacements cannot be used as degrees-of-freedom, which must be independent components by definition. For these reasons, Tessellica uses the following mode superposition strategy, termed as "defect-free solution scheme".

The "defect-free four-node finite element formulation" implements the defect-free solution scheme using "defect-free four-node finite elements". Tessellica discretizes the solution space for four-node finite elements into eight independent modes which constitute the eight degrees-of-freedom. The strategy of automatic "recognition" of the continuum response in terms of modes, and the subsequent numerical determination of the element stresses, displacements as well as nodal forces and displacements, is akin to the neural network computational scheme. The heuristics in Mathematica algebraic equation solvers are used in the implementation of the neural network model in Tessellica.

Figure 1:
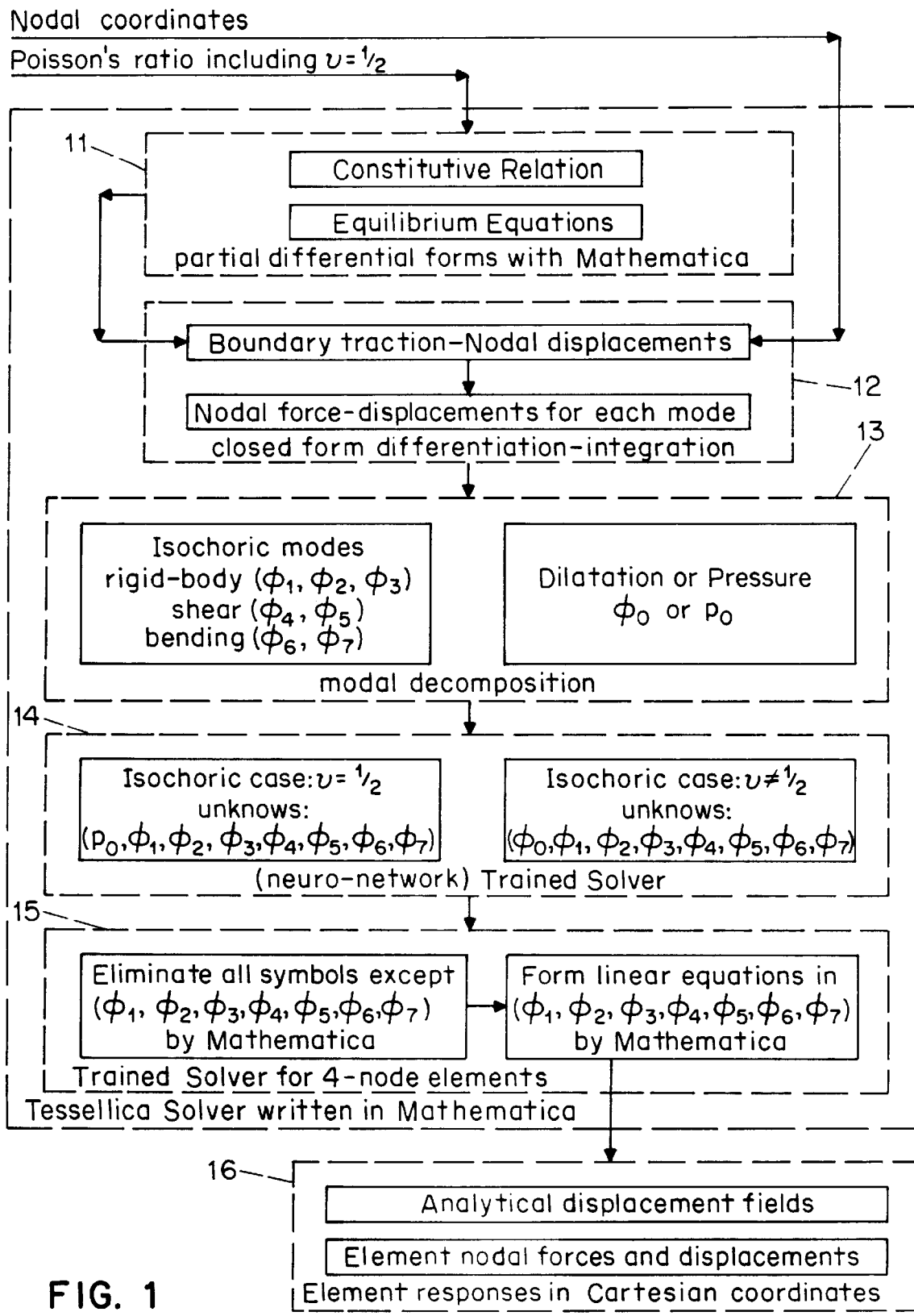
FIG. 1 is a block diagram of a computer system implementing a technique in accordance with a preferred embodiment of the invention.

With reference to FIG. 1, a computer implementation of the present technique can include the following modules:

For given material properties, a constitutive relation-equilibrium equation module 11 sets up a complete set of displacement equations which will satisfy the equilibrium equation of continuum mechanics exactly, without approximation. This complete set consists of six non-bending modes for a three-node triangular element, and eight modes including bending modes for a quadrilateral or a four-node triangular element.

A nodal force-displacement module 12 performs the following functions: First, it samples the displacement profiles at the nodal locations to yield nodal displacements. Second, it performs analytical differentiation on the displacement profiles to obtain stresses. Finally, it performs analytical integration on the stresses to obtain the nodal forces. For each mode, a pair consisting of the nodal displacements and nodal forces is obtained for each element.

For book-keeping purposes, to facilitate the neural-network model of equation solving, module 13 is used to isolate the modes associated with the change in volume for compressible elements and the isotropic pressure for incompressible elements from the remainder. Each pair from the nodal displacement list and nodal force list is used in the neural-network "training" phase to identify the distinct modes. The mathematical tools behind modal decomposition are implemented via rules in the Mathematica programming language.

Module 14 organizes the element modal variables and performs modal analysis pertaining to the nodal force-displacement data, after being "trained" according to module 13.

Module 15 carries out the arithmetic and yields the numerical values of the modal participation factors for all elements by using various equation solvers and solving techniques provided by Mathematica. Reorganization of equations, e.g equation re-numbering is automatically done by Mathematica without any additional command.

In module 16, the modal variables are used as weights to compute the actual displacement, strain and stress fields within the element. These results are obtained as linear functions in coordinate variables for strain and stress fields and the displacement functions in the two-directions on the plane are recovered as quadratic polynomials in coordinate variables.

Figure 2A:
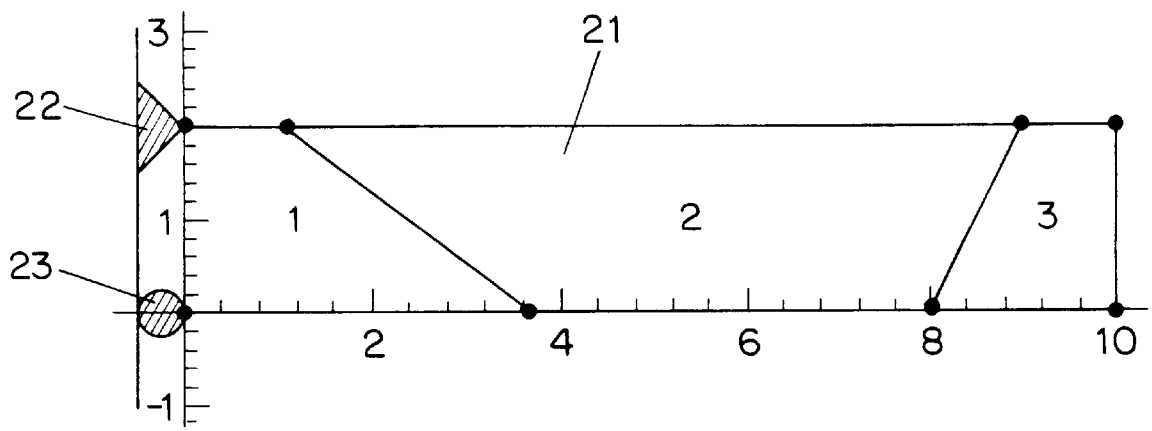
FIG. 2A is a schematic of an undeformed beam specimen discretized by three preassigned quadrilateral finite elements, representing a benchmark problem which has been analyzed for demonstration and confirmation of the technique to yield exact responses.
Figure 2B:
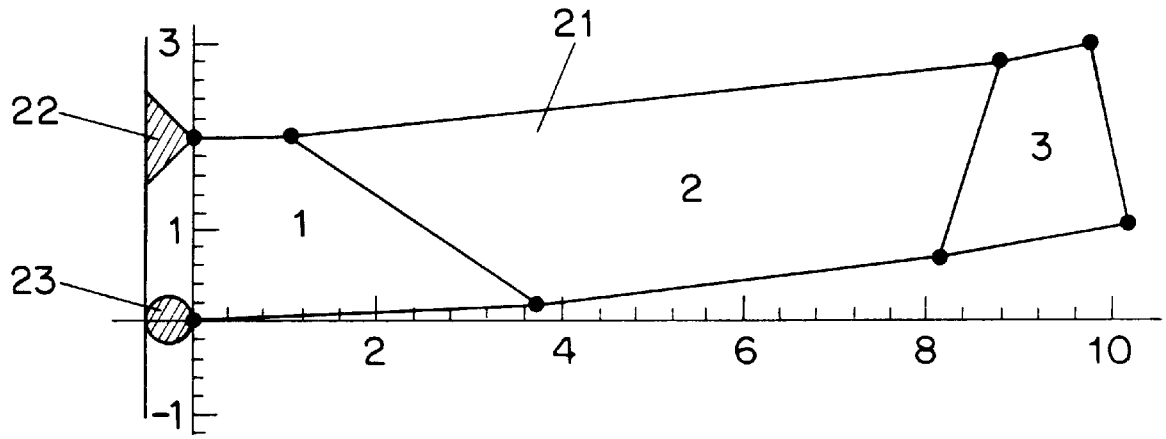
FIG. 2B is a schematic of the deformed configuration of the specimen of FIG. 2A subjected to an end bending moment at the free end.

FIG. 2A and 2B show a cantilever 21 in an x–y coordinate system. The cantilever 21 is supported along at the y-axis with a hinge 22 and a roller 23. The cantilever 21 is divided into three finite-element quadrilaterals 1–3 which are amenable to the present technique.

Figure 3A:
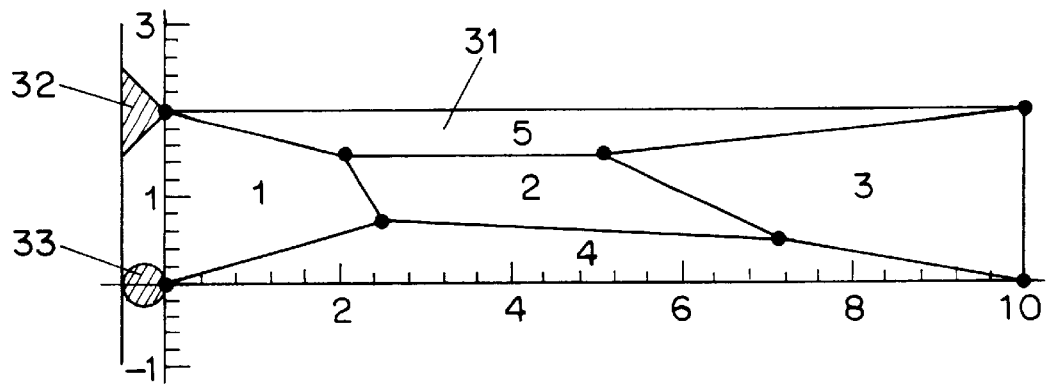
FIG. 3A is a schematic of an undeformed beam specimen discretized by five preassigned quadrilateral finite elements, representing a further benchmark problem which has been analyzed for demonstration and confirmation of the technique to yield exact responses.
Figure 3B:
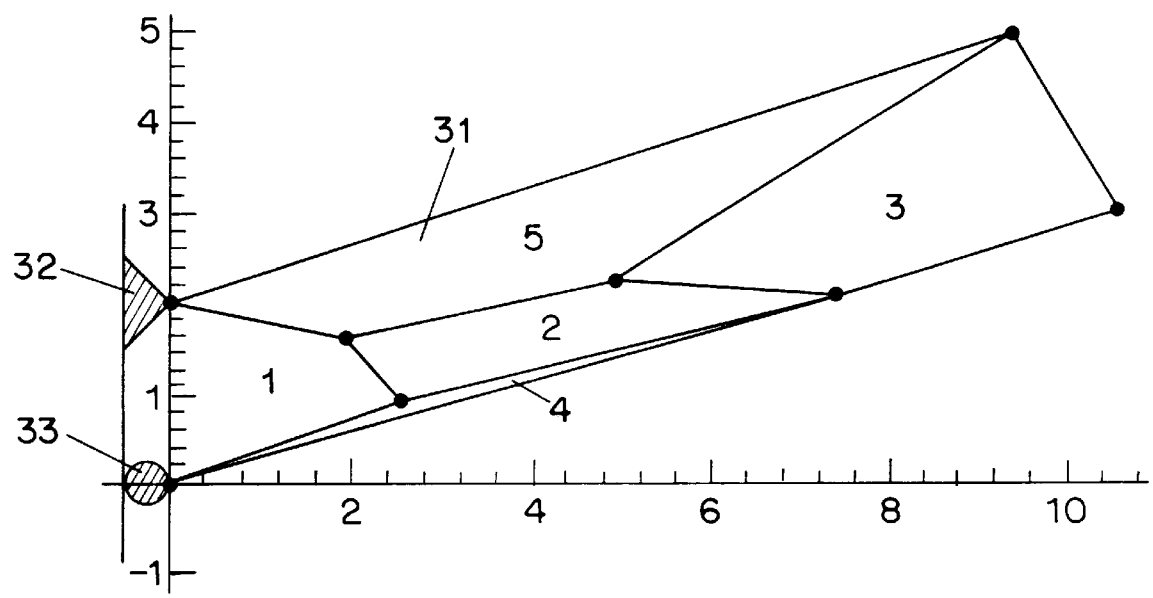
FIG. 3B is a schematic of the deformed configuration of the specimen of FIG. 3A subjected to an end bending moment at the free end.

FIG. 3A and 3B show a cantilever 31 in an x–y coordinate system. The cantilever 31 is supported along the y-axis with a hinge 32 and a roller 33. The cantilever 31 is divided into five finite-element quadrilaterals 1–5 which are amenable to the present technique.

Figure 4:
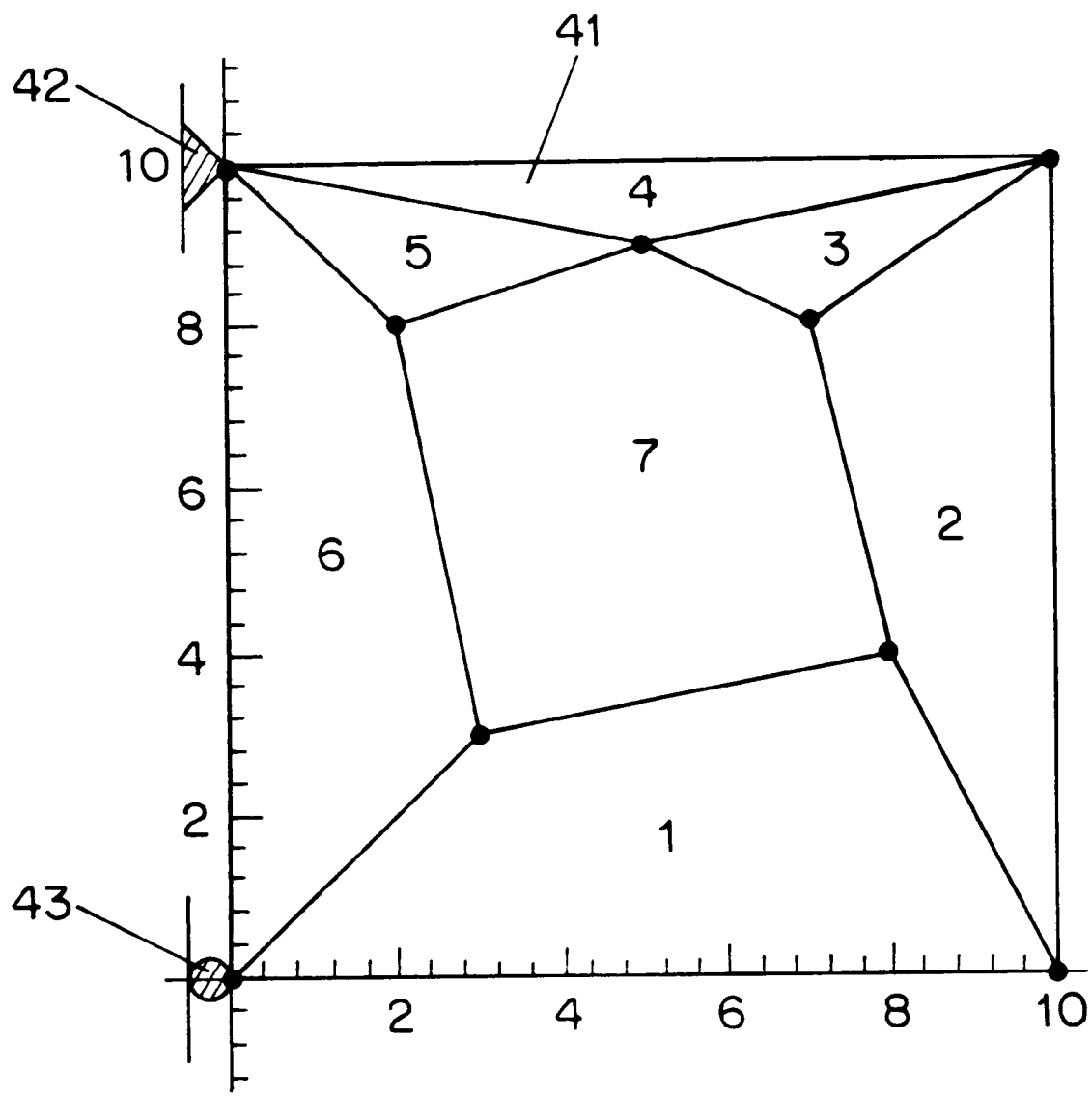
FIG. 4 is a schematic of a third case, with preassigned triangular and quadrilateral finite elements surrounding a pentagonal finite element, representing a solid structure which has been analyzed for demonstration of conformability of the technique with elements other than quadrilaterals where uniform stress problems are solved and exact results are reproduced.

FIG. 4 shows a cantilever 41 in an x–y coordinate system. The cantilever 41 is supported along the y-axis with a hinge 42 and a roller 43. For finite-element analysis, the cantilever 41 is divided into seven elements 1–7, including three triangles 3–5, three quadrilaterals 1, 2 and 6, and a pentagon 7. This configuration was satisfactorily analyzed only for patch modes, with the present technique being used for the pentagonal element 7 as well.

Figure 5:
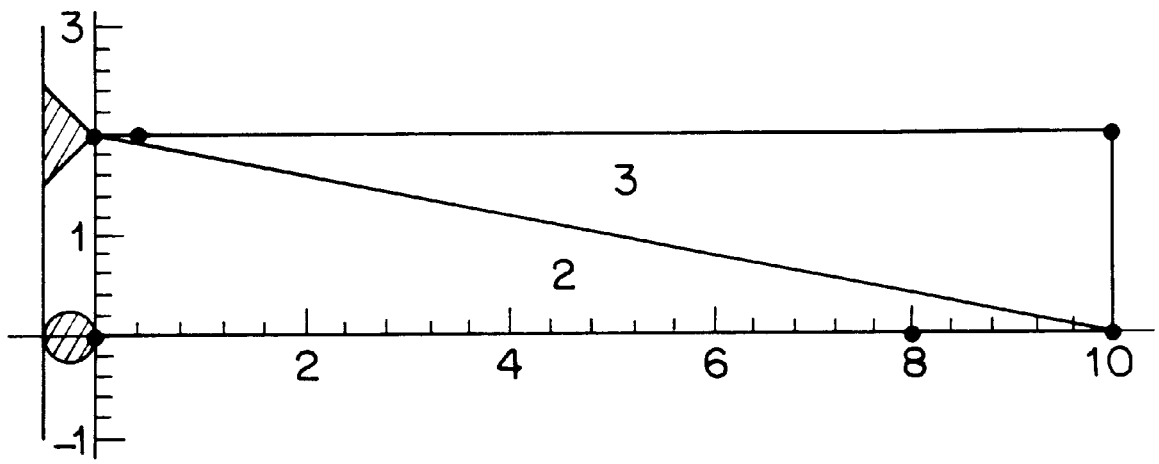
FIGS. 5–8 are schematics, analogous to those of FIGS. 2A and 3A, of specimens for which crucial parts of computer output are presented in the Appendix.

For the cantilever of FIG. 5 with two four-node triangular elements, representative Tessellica output is given in the Appendix. The location of the side nodes were selected at random. Compared with the exact solution, the numerical error is shown to be of the order of $10^{-8}$.

Figure 6:
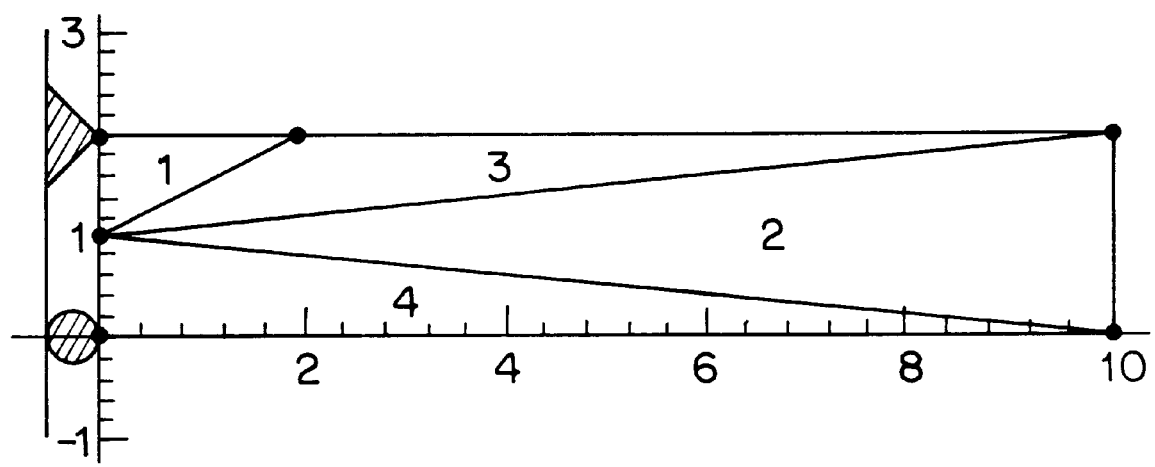
Figure 7:
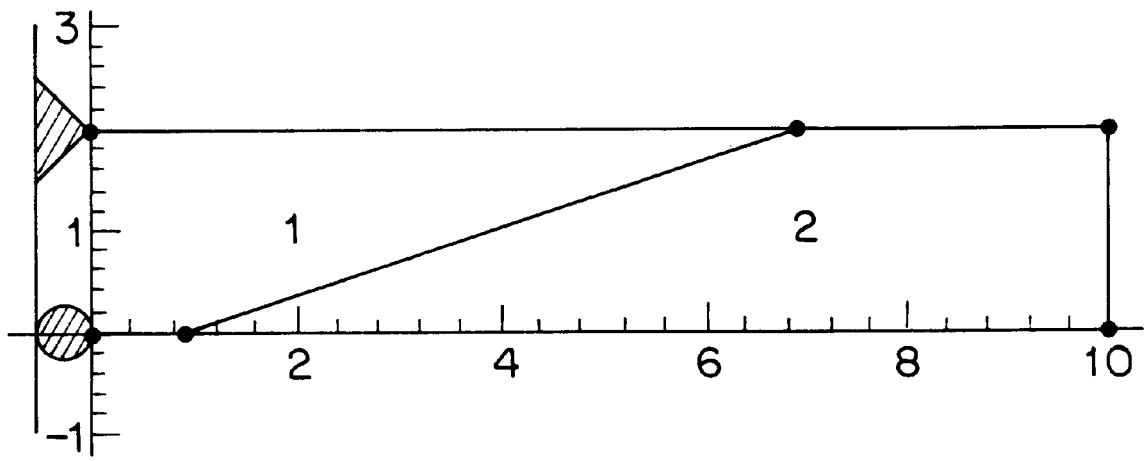
Figure 8:
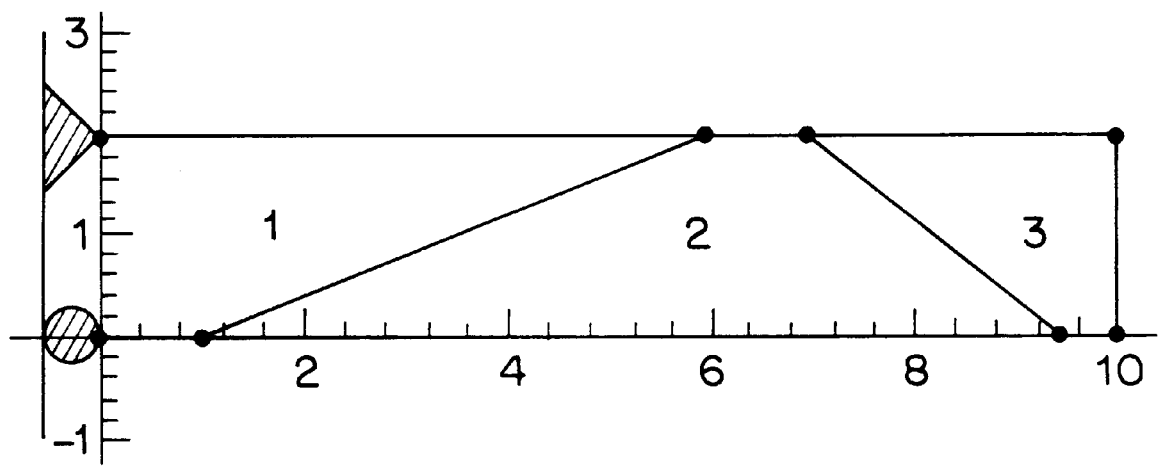

The Tessellica output for the specimens of FIGS. 6–8 is for incompressible materials. Triangular elements are used in FIG. 6. Output for the specimens of FIGS. 7 and 8 shows that Tessellica results pass both the patch test and the zero-locking test.

In a special case of interest in engineering applications, a four-node element has three collinear nodes and a fourth node away from that line. The resulting element may be termed a degenerate quadrilateral. The present technique is equally applicable in this case of a triangle with an intermediate side node.

The formulas given above for the displacement components are valid for an isotropic material, characterized by the Poisson's ratio v. One of the displacement components is x·y. The other displacement component does not have a cross term (x·y).

Similarly to characterize an anisotropic body, more than one such ratio is required, and corresponding displacement formulas may be complicated and difficult to obtain algebraically. Still, values of the displacement function can be obtained with a numerical implementation, taking into account the different Poisson's ratios. To obtain such values, the Mathematica procedures developed to formulate the test functions for the isotropic case can be used.

The modal decomposition technique is also suitable for shell elements where the test functions are cubic polynomials in the coordinates for five nodes, and fourth-order polynomials in the coordinate variables for six nodes.

I claim:

1. A computer method for determining stress, strain and/or deformation in a two-dimensional solid for applications in manufacturing/construction of load bearing structures, comprising:

generating a set of static deformation modes for an element of the solid, wherein dimensionless systems parameters are utilized for determining at least one of the modes;

generating, from the modes and locations of element boundary nodes, coefficients for each one of a set of test functions; and algebraically generating a defect-free nodal force-displacement relationship from the test functions and a stress-versus-strain matrix.

2. The computer method according to claim 1, wherein the element is a general, convex quadrilateral element.

3. The computer method according to claim 1, wherein the element is a triangular element with one additional node on a side of the triangle.

4. A computer method for determining stress, strain and/or deformation in a two-dimensional solid for applications in manufacturing/construction of load-bearing structures, comprising:

generating a set of static deformation modes including bending modes for an element of the solid, wherein a Poisson's ratio of the solid is utilized for determining at least one of the bending modes;

generating a set of test functions from the modes; and generating a defect-free nodal force-displacement relationship from the test functions and a stress-versus-strain matrix.

5. The computer method according to claim 4, wherein the element is a general, convex quadrilateral element.

6. The computer method according to claim 4, wherein the element is a triangular element with one additional node on a side of the triangle.

7. The computer method according to claim 4, wherein Poisson's ratio is different from $\frac{1}{2}$.

8. The computer method according to claim 4, wherein Poisson's ratio is exactly equal to $\frac{1}{2}$.

9. A computer method for determining stress, strain and/or deformation in a two-dimensional plane-stress isotropic solid with Poisson's ratio v for applications in manufacturing/construction of load-bearing structures, comprising:

generating a set of eight modes for a four-node element of the solid, the set consisting of three rigid-body modes, three uniform-stress modes and two bending modes here designated as x-span bending mode and y-span bending mode, respectively, the x-span bending mode having x- and y-displacement components for plane stress: $x \cdot y$ and $-\frac{1}{2} \cdot (x^2 + v/(1-v) \cdot y^2)$, and the y-span bending mode having x- and y-displacement components for plane stress: $-\frac{1}{2} \cdot (y^2 + v/(1-v) \cdot x^2)$ and $x \cdot y$;

generating a set of test functions from the modes, and generating a defect-free nodal force-displacement relationship from the test functions and a stress-versus-strain matrix.

10. The computer method according to claim 9, wherein the element is a general, convex quadrilateral element.

11. The computer method according to claim 9, wherein the element is a triangular element with one additional node on a side of the triangle.

12. The computer method according to claim 9, wherein Poisson's ratio is different from $\frac{1}{2}$.

13. The computer method according to claim 9, wherein Poisson's ratio is exactly equal to $\frac{1}{2}$.

14. A computer method for determining stress, strain and/or deformation in a two-dimensional plane-strain isotropic solid with Poisson's ratio v for applications in manufacturing/construction of load-bearing structures, comprising:

generating a set of eight modes for a four-node element of the solid, the set consisting of three rigid-body modes, three uniform-stress modes and two bending modes here designated as x-span bending mode and y-span bending mode, respectively, the x-span bending mode having x- and y-displacement components for plain strain: $x \cdot y$ and $-\frac{1}{2} \cdot (x^2 + v \cdot y^2)$, and the y-span bending mode having x- and y-displacement components for plain strain: $-\frac{1}{2} \cdot (y^2 + v \cdot x^2)$ and $x \cdot y$;

generating a set of test functions from the modes, and generating a defect-free nodal force-displacement relationship from the test functions and a stress-versus-strain matrix.

15. The computer method according to claim 14, wherein the element is a general, convex quadrilateral element.

16. The computer method according to claim 14, wherein the element is a triangular element with one additional node on a side of the triangle.

17. The computer method according to claim 14, wherein Poisson's ratio is different from $\frac{1}{2}$.

18. The computer method according to claim 14, wherein Poisson's ratio is exactly equal to $\frac{1}{2}$.

* * * * *